(12) United States Patent
Choi et al.

(10) Patent No.: US 7,570,530 B2
(45) Date of Patent: Aug. 4, 2009

(54) NONVOLATILE MEMORY DEVICE USING VARIABLE RESISTIVE ELEMENT

(75) Inventors: Byung-gil Choi, Yongin-si (KR); Du-eung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/052,761

(22) Filed: Mar. 21, 2008

(65) Prior Publication Data

US 2008/0232177 A1    Sep. 25, 2008

(30) Foreign Application Priority Data

Mar. 22, 2007    (KR) ...................... 10-2007-0028202

(51) Int. Cl.
*G11C 7/02*    (2006.01)

(52) U.S. Cl. ................................. 365/206; 365/189.06

(58) Field of Classification Search ................. 365/148, 365/163, 189.06, 206; 257/2–5; 438/95–96
See application file for complete search history.

(56) References Cited

U.S. PATENT DOCUMENTS 6,337,824 B1 * 1/2002 Kono et al. ................. 365/207
6,795,338 B2 * 9/2004 Parkinson et al. ........... 365/163

FOREIGN PATENT DOCUMENTS

| JP | 2006079756 A | 3/2006 |
| JP | 2006185533 | 7/2006 |
| KR | 1020010005003 A | 1/2001 |
| KR | 1020040059272 A | 7/2004 |
| KR | 1020050029013 A | 3/2005 |

* cited by examiner

*Primary Examiner*—Richard Elms
*Assistant Examiner*—Harry W Byrne
(74) *Attorney, Agent, or Firm*—Volentine & Whitt, PLLC

(57) ABSTRACT

Disclosed is a nonvolatile memory device using a variable resistive element, and a data read circuit for use in variable resistive memory devices. More specifically, embodiments of the invention provide a data read circuit with one or more decoupling units to remove noise from one or more corresponding control signals. For instance, embodiments of the invention remove noise from a clamping control signal, a read bias control signal, and/or precharge signal. The disclosed decoupling units may be used alone or in any combination. Embodiments of the invention are beneficial because they can increase sensing margin and improve the reliability of read operations in memory devices with variable resistive elements.

20 Claims, 9 Drawing Sheets

NONVOLATILE MEMORY DEVICE USING VARIABLE RESISTIVE ELEMENT

CROSS REFERENCE TO RELATED APPLICATION

This application claims priority from Korean Patent Application No. 10-2007-0028202 filed on Mar. 22, 2007 in the Korean Intellectual Property Office, the disclosure of which is incorporated herein by reference in its entirety.

BACKGROUND OF THE INVENTION

1. Field of the Invention

The present invention relates to a phase change memory device, and more particularly, to a phase change memory device that has improved reliability in a read operation.

2. Description of the Related Art

Examples of a nonvolatile memory device that uses a resistance material include a phase change random access memory (PRAM), a resistive random access memory (RRAM), a magnetic RAM (MRAM), and the like. A dynamic RAM (DRAM) device or a flash memory device stores data by using an electric charge, while a nonvolatile memory device that uses a resistance material stores data by using a change in state of a phase change material (PRAM), such as a chalcogenide alloy, a change in resistance of a variable resistive material (RRAM), and a change in resistance of a magnetic tunnel junction (MTJ) thin film due to a magnetization state of a ferromagnetic substance (MRAM).

The following description uses a phase change memory cell as an example. A state of a phase change material is changed to a crystal state or an amorphous state while being cooled down after a heating process. Since the phase change material in the crystal state has low resistance and the phase change material in the amorphous state has high resistance, the crystal state may be defined as set data or 0 data, and the amorphous state may be defined as reset data or 1 data.

A conventional circuit that reads data stored in the phase change memory cell includes a clamping unit that is coupled between a bit line and a sensing node and clamps the bit line to a predetermined bias level in response to a clamping control signal, a read bias supply unit that applies a current for reading a resistance level of the phase change memory cell to the sensing node in response to a read bias control signal, and a sense amplifier that compares a level of the sensing node with a reference level and outputs the comparison result.

The clamping control signal, the read bias control signal, and the like may be affected by various kinds of noises during the read operation of the phase change memory device. This reduces a sensing margin, and thus, it may be impossible for the sense amplifier to accurately differentiate a set state from a reset state. That is, an operation error may occur during the read operation. Read circuits that improve operational reliability are therefore needed.

SUMMARY OF THE INVENTION

One aspect of the invention provides a nonvolatile memory device using a variable resistive element. Another aspect of the invention provides a data read circuit for use in variable resistive memory devices.

More specifically, embodiments of the invention provide a data read circuit with one or more decoupling units to remove (or substantially reduce) noise from one or more corresponding control signals. For instance, embodiments of the invention remove noise from a clamping control signal, a read bias control signal, and/or precharge signal. The disclosed decoupling units may be used alone or in any combination. Embodiments of the invention are beneficial because they can increase sensing margin and improve the reliability of read operations in memory devices with variable resistive elements.

According to an aspect of the present invention, there is provided a nonvolatile memory device including: a memory cell array having a plurality of nonvolatile memory cells, a selection circuit coupled to the memory cell array and configured to select at least one of the plurality of nonvolatile memory cells, and a data read circuit coupled to the memory cell array, the data read circuit configured to read data from the selected nonvolatile memory cell, the data read circuit including: a clamping unit coupled between a sensing node and a bit line associated with the selected nonvolatile memory cell, the clamping unit configured to clamp the bit line to a predetermined bias level in response to a clamping control signal, a precharge unit coupled to the sensing node and configured to precharge the sensing node in response to a precharge signal, a read bias supply unit coupled to the sensing node and configured to supply a read bias to the sensing node in response to a read bias control signal, a sense amplifier coupled to the sensing node and a reference level, the sense amplifier configured to compare a level of the sensing node with a reference level and output a comparison result, and a first decoupling unit coupled to the clamping control signal or the read bias control signal, and configured to reduce noise in the clamping control signal or the read bias control signal.

BRIEF DESCRIPTION OF THE DRAWINGS

The above and other features and advantages of the present invention will become more apparent by describing in detail preferred embodiments thereof with reference to the attached drawings in which.

DESCRIPTION OF THE EMBODIMENTS

Figure 1:
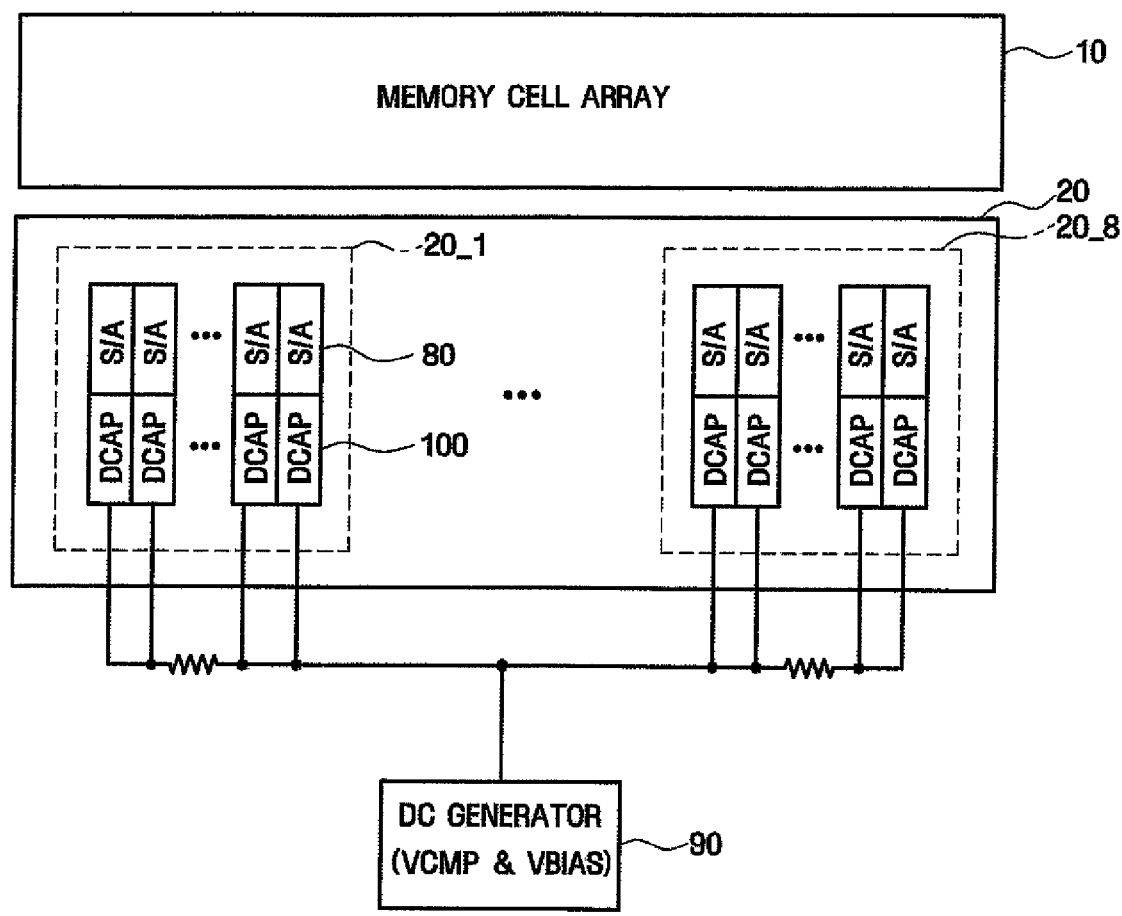
FIG. 1 is a block diagram illustrating a nonvolatile memory device according to embodiments of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element is referred to as being "connected to" or "coupled to" another element, it can be connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, etc. may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements.

In addition, when terms used in this specification are not specifically defined, all the terms used in this specification (including technical and scientific terms) can be understood by those skilled in the art. Further, when general terms defined in the dictionaries are not specifically defined, the terms will have the normal meaning in the art.

Hereinafter, a description will be made of embodiments of the present invention by using phase change random access memory (PRAM) devices. However, it will be apparently understood by those skilled in the art that the present invention can be applied to nonvolatile memory devices that use resistance materials, such as resistive RAM (RRAM) devices, ferroelectric RAM (FRAM) devices, and the like.

FIG. 1 is a block diagram illustrating a nonvolatile memory device according to embodiments of the present invention.

Referring to FIG. 1, the nonvolatile memory device according to the embodiments of the present invention includes a memory cell array 10, a data read circuit 20, and a DC generator 90.

The memory cell array 10 includes a plurality of nonvolatile memory cells (not shown) that are arranged in a matrix. Each of the nonvolatile memory cells may include a variable resistive element that contains a phase change material having two different resistance values according to a crystal state and an amorphous state, and an access element that controls a current flowing through the variable resistive element. The access element may be a diode, a transistor, or the like, which is connected in series to the various resistive element. Further, examples of the phase change materials may include various kinds of materials, such as GaSb, InSb, InSe, Sb2Te3, and GeTe in which two elements are chemically combined with each other, GeSbTe, GaSeTe, InSbTe, SnSb2Te4, and InSbGe in which three elements are chemically combined with one another, and AgInSbTe, (GeSn)SbTe, GeSb(SeTe), and Te81Ge15Sb2S2 in which four elements are chemically combined with one another. Among them, GeSbTe that contains germanium (Ge), antimony (Sb), and tellurium (Te) is mainly used as the phase change material.

Though not shown in FIG. 1, the nonvolatile memory device includes a selection circuit that selects at least one nonvolatile memory cell to be read from the memory cell array 10.

Further, the data read circuit 20 reads data stored in the nonvolatile memory cell that is selected from the memory cell array 10. The data read circuit 20 shown in FIG. 1 may include a plurality of sub-circuits 20_1 to 20_8. For purpose of explanation, in the sub-circuits 20_1 to 20_8, other functional blocks (for example, 40, 50, 60, and 70 of FIG. 2) are not illustrated, but sense amplifiers 80 and decoupling units 100 are illustrated. Detailed exemplary structures will be described below with reference to FIGS. 2, 5, 8, and 9. Each of the sub-circuits 20_1 to 20_8 may include, for example, sixteen sense amplifiers 80. For example, when one sub-circuit (for example, 20_1) is enabled during an asynchronous read operation, the nonvolatile memory device according to the embodiments of the present invention can read, for example, data of one word (that is, 16 bits) at a time. As the eight sub-circuits 20_1 to 20_8 1 are enabled during a synchronous read operation, the nonvolatile memory device can read data of eight words (that is, 128 bits) at a time.

The DC generator 90 generates, for example, a clamping control signal VCMP and/or a read bias control signal VBIAS. The DC generator 90 is coupled to each of the sub-circuits 20_1 to 20_8 to supply the clamping control signal VCMP and/or the read bias control signal VBIAS to each of the sub-circuits 20_1 to 20_8.

In particular, each of the sub-circuits 20_1 to 20_8 of the nonvolatile memory device according to the embodiments of the present invention includes the decoupling units 100 so as to remove noise of the clamping control signal VCMP and/or the read bias control signal VBIAS. In this way, it is possible to increase a sensing margin and accurately differentiate a set state from a reset state.

Figure 2:
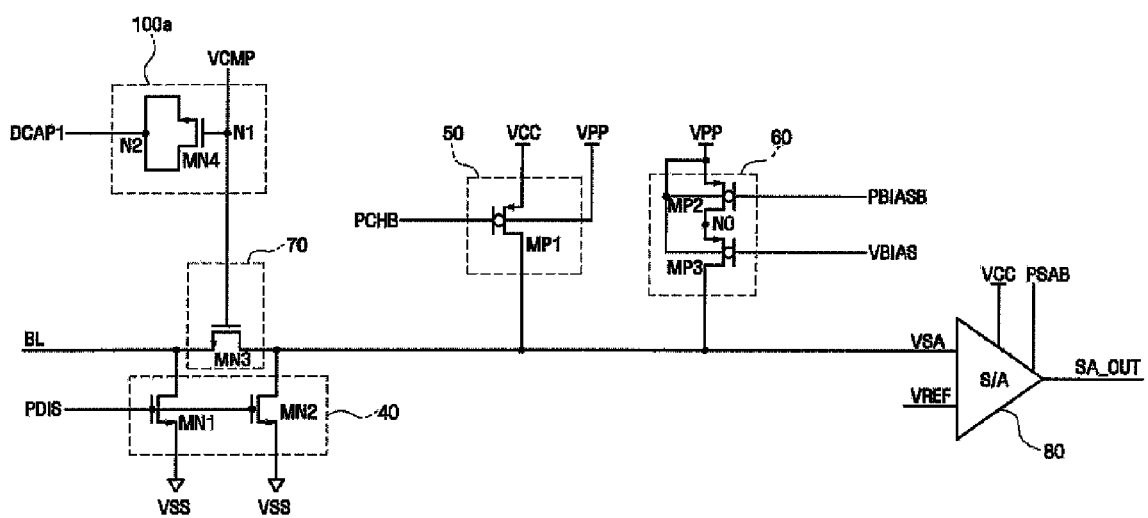
FIG. 2 is a circuit diagram illustrating a data read circuit that is used in a nonvolatile memory device according to a first embodiment of the present invention.
Figure 3:
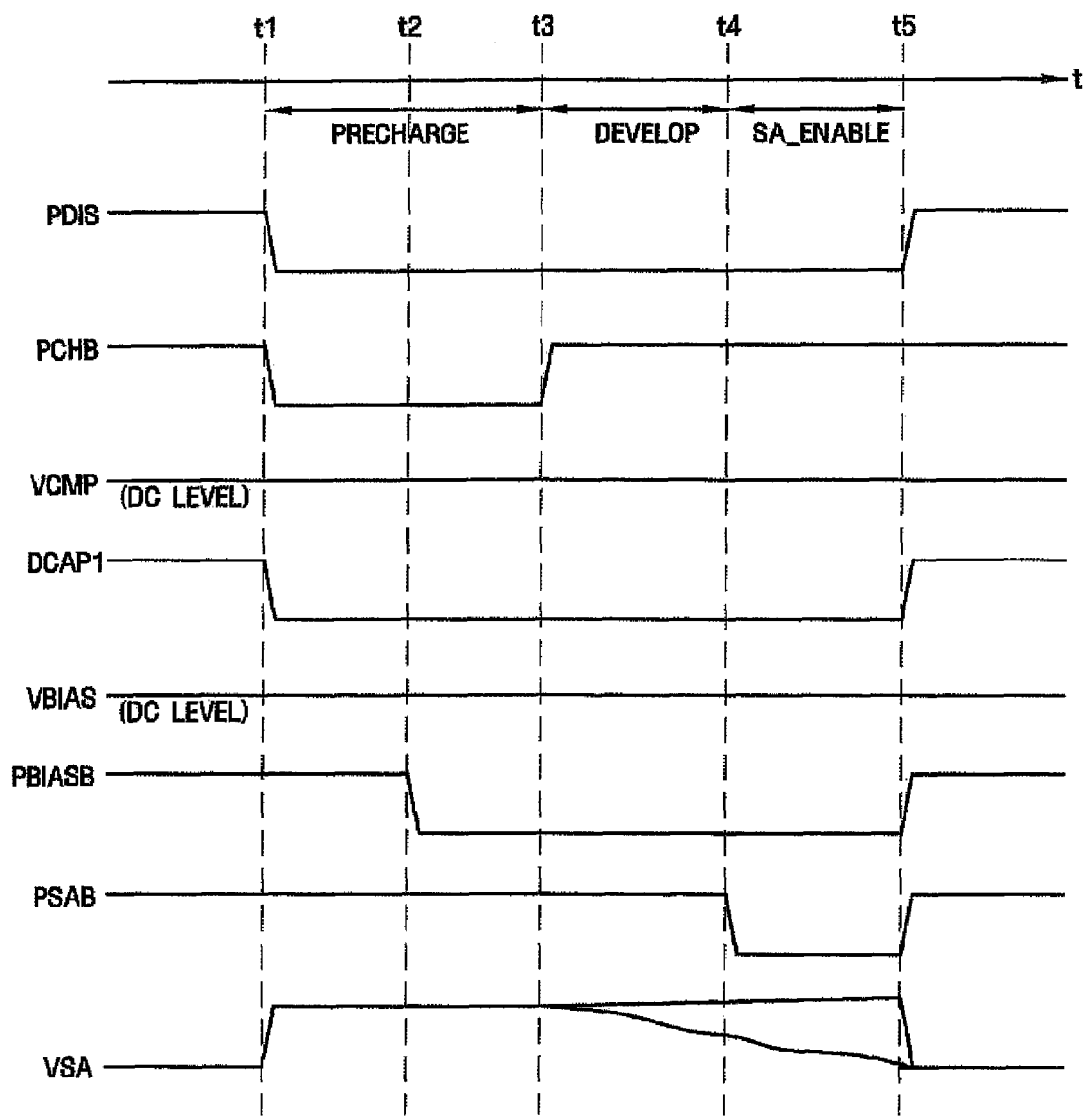
FIG. 3 is a timing diagram illustrating the operation of the data read circuit shown in FIG. 2.
Figure 4:
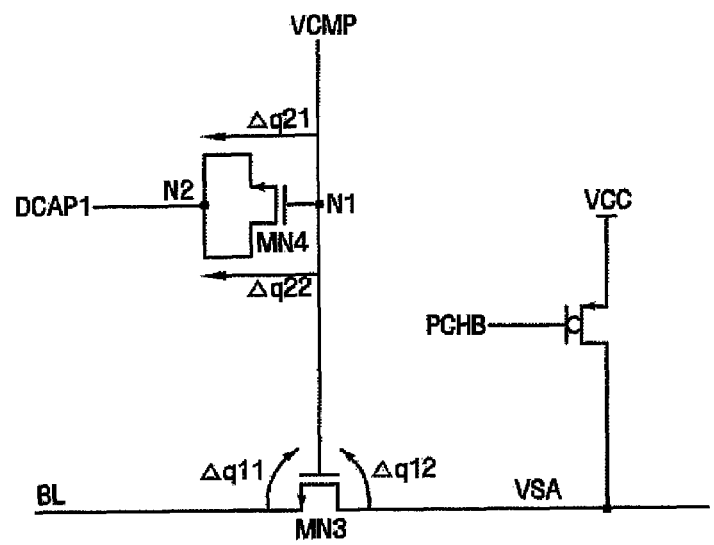
FIG. 4 is a circuit diagram of a portion of the data read circuit shown in FIG. 2.

FIG. 2 is a circuit diagram illustrating a data read circuit that is used in a nonvolatile memory device according to a first embodiment of the present invention. FIG. 3 is a timing diagram illustrating the operation of the data read circuit shown in FIG. 2. FIG. 4 is a circuit diagram of a portion of the data read circuit shown in FIG. 2.

First, referring to FIG. 2, the data read circuit that is used in the nonvolatile memory device according to the first embodiment of the present invention includes a discharge unit 40, a precharge unit 50, a read bias supply unit 60, a clamping unit 70, a sense amplifier 80, and a decoupling unit 100a.

The discharge unit 40 discharges a sensing node VSA and/or a bit line BL coupled to a nonvolatile memory cell that is selected before the data read operation, with a predetermined level, for example, with a ground voltage VSS. The discharge unit 40 may include an NMOS transistor MN1 that is coupled between the bit line BL and the ground voltage terminal VSS and has a gate to which a discharge signal PDIS is applied, and an NMOS transistor MN2 that is coupled between a sensing node VSA and the ground voltage terminal VSS and has a gate to which the discharge signal PDIS is applied.

The precharge unit 50 precharges the sensing node VSA with a predetermined level, for example, with a power supply voltage VCC for a precharge period during the data read operation. As shown in FIG. 2, the precharge unit 50 may be a PMOS transistor MP1 that is coupled between the power supply voltage VCC and the sensing node VSA and includes a gate to which a precharge signal PCHB is applied.

In order to read a resistance level of the selected nonvolatile memory cell, the read bias supply unit 60 supplies a read bias to the sensing node VSA in response to a read bias control signal VBIAS. When the data stored in the nonvolatile memory cell is set data, since the phase change material has low resistance, a large amount of current flows through the nonvolatile memory cell. When the data is reset data, since the phase change material has high resistance, a small amount of current flows through the nonvolatile memory cell. Here, the read bias that is supplied by the read bias supply unit 60 may compensate for the through current in the reset state. When the reset data is stored, a level of the sensing node VSA remains constant or increases by a small degree, while when the set data is stored, the level of the sensing node VSA decreases. Therefore, since there is a large difference between the level of the sensing node VSA in the reset state and the level of the sensing node VSA in the set state, it is easy to differentiate the set state from the reset state. In this way, it is possible to increase the sensing margin. The read bias supply unit 60 having the above-described structure may include a PMOS transistor MP2 that is coupled between a boost voltage terminal VPP and a node N0. The PMOS transistor MP2 has a gate to which a selection signal PBIASB is applied. A PMOS transistor MP3 is coupled between the node N0 and the sensing node VSA and has a gate to which the read bias control signal VBIAS is applied. A substrate region in which the PMOS transistors MP2 and MP3 are formed may be coupled to the boost voltage terminal VPP. The read bias control signal VBIAS may be a constant voltage signal, but the present invention is not limited thereto.

The clamping unit 70 clamps the bit line BL to a predetermined bias level, for example, to a level within an appropriate range for reading data. Specifically, the clamping unit 70 clamps the bit line BL to a predetermined level less than a level of a threshold voltage Vth of the phase change material. When the predetermined level is equal to or larger than the level of the threshold voltage Vth, a phase of the phase change material of the selected nonvolatile memory cell may be changed. The clamping unit 70 may be an NMOS transistor MN3 that is coupled between the bit line BL and the sensing node VSA and includes a gate to which the clamping control signal VCMP is applied. Here, the clamping control signal VCMP may be a constant voltage signal, but the present invention is not limited thereto.

The sense amplifier 80 compares the level of the sensing node VSA with a reference level VREF, and outputs the comparison result. In the first embodiment of the present invention, the sense amplifier 80 may be a current sense amplifier that senses a change in current, which flows through the bit line BL of the selected nonvolatile memory cell, with respect to a reference current, or a voltage sense amplifier that senses a change in voltage with respect to a reference voltage. In FIG. 2, the voltage sense amplifier is illustrated as an example. Further, the sense amplifier 80 may perform the operation in response to a sense amplifier enable signal PSAB.

The decoupling unit 100a removes noise from the clamping control signal VCMP. Specifically, when the precharge unit 50 starts to precharge the sensing node VSA, the decoupling unit 100a removes noise that affects the clamping control signal VCMP. The detailed description thereof will be described below with reference to FIGS. 3 and 4. The decoupling unit 100a may include a first decoupling capacitor MN4 that is coupled between the first node N1 to which the clamping control signal VCMP is applied and the second node N2 to which a first decoupling signal DCAP1 is applied. For example, as shown in FIG. 2, the first decoupling capacitor MN4 may be an MOS capacitor. Specifically, the MOS capacitor may include a gate to which the clamping control signal VCMP is applied and a source and a drain to which the first decoupling signal DCAP1 is applied.

The operation of the data read circuit will now be described with reference to FIGS. 2 to 4

First, the discharge signal PDIS is activated at a high level before time t1. Therefore, the NMOS transistors MN1 and MN2 of the discharge unit 40 discharge the sensing node VSA and the bit line BL coupled to the selected nonvolatile memory cell, with the ground voltage VSS.

At time t1, the discharge signal PDIS is inactivated at a low level and the precharge signal PCHB is activated at a low level. Therefore, the PMOS transistor MP1 of the precharge unit 50 precharges the sensing node VSA with the power supply voltage VCC. The voltage of the sensing node VSA may increase from 0 V to approximately 1.8 V. Since the bit line BL is clamped by the clamping unit 70, the voltage of the bit line BL may increase from 0 V to approximately 1.3 V. At this time, the first decoupling signal DCAP1 is activated at a low level, such that the noise generated in the clamping control signal VCMP is removed. Here, the first decoupling signal DCAP1 may be a signal that transits when the precharge unit 50 starts to precharge the sensing node VSA, and has a voltage difference from the clamping control signal VCMP. For example, in FIG. 3, when the precharge signal PCHB is activated at the low level, the first decoupling signal DCAP1 is transited from a high level to a low level.

When the voltage of the sensing node VSA and the voltage of the bit line BL increase, the voltage of the sensing node VSA and the voltage of the bit line BL may affect the clamping control signal VCMP. That is, noise may be generated in the clamping control signal VCMP. As shown in FIG. 4, charges $\Delta q11$ and $\Delta q12$ are transmitted from the sensing node VSA and the bit line BL to the first node N1, to which the clamping control signal VCMP is applied, through a parasitic capacitor between the gate and a source of the NMOS transistor MN3 and a parasitic capacitor between the gate and a drain thereof. In this case, a voltage level of the clamping control signal VCMP may not remain constant. At this time, in the first embodiment of the present invention, since the first decoupling signal DCAP1 is activated at the low level, the charges $\Delta q11$ and $\Delta q12$ transmitted to the first node N1, to which the clamping control signal VCMP is applied, move to the second node N2 through the first decoupling capacitor MN4 to which the first decoupling signal DCAP1 is applied (see $\Delta q21$ and $\Delta q22$).

Meanwhile, in order to maintain the level of the clamping control signal VCMP, charges $\Delta q11$ and $\Delta q12$ transmitted to the first node N1 may have the same amount as charges $\Delta q21$ and $\Delta q22$ that move to the second node N2. Therefore, the NMOS transistor MN3 of the clamping unit 70 and the MOS capacitor MN4 of the decoupling unit 100a may be adjusted to have the same size. Here, the size of each of the MOS transistor and the MOS capacitor refers to a ratio between width W and length L of a channel region, that is, W/L. When the MOS transistor and the MOS capacitor have the same size, it means that W/L of the MOS transistor is equal to that of the MOS capacitor or that the difference between W/L of the MOS and W/L of the MOS capacitor corresponds to an error that may occur during the process. For example, the width and length of the NMOS transistor MN3 are W1 and L1, respectively, and the width and length of the MOS capacitor MN4 are W2 and L2, respectively, W1=W2 and L1=L2 may be specified.

Referring to FIG. 3 again, at time t2, a selection signal PBIASB is activated at a low level, such that the read bias supply unit 60 supplies a read bias to the sensing node VSA.

At time t3, the precharge signal PCHB is inactivated at a high level, and the selection signal PBIASB maintains the low level. Therefore, the level of the sensing node VSA changes according to the data that is stored in the selected nonvolatile memory cell. That is, a develop operation is performed. Specifically, when the data stored in the nonvolatile memory cell is set data, since the phase change material has small resistance, a large amount of current flows through the nonvolatile memory cell. When the stored data is reset data, since the phase change material has large resistance, a small amount of current flows through the nonvolatile memory cell. Therefore, when the reset data is stored, the level of the sensing node VSA remains constant or increases by a small degree, while when the set data is stored, the level of the sensing node VSA decreases.

At time t4, the sense amplifier enable signal PSAB is enabled at a low level. Therefore, the sense amplifier 80 compares the level of the sensing node VSA with the reference level VREF and outputs the comparison result.

At time t5, the discharge signal PDIS is activated again to a high level, and the first decoupling signal DCAP1, the selection signal PBIASB, and the sense amplifier enable signal PSAB are inactivated at a high level. In this way, the read operation ends.

As shown in FIG. 3, the clamping control signal VCMP may be a constant voltage signal. However, the clamping control signal VCMP may be a pulse signal that is only activated during the read operation. As shown in FIG. 3, the read bias control signal VBIAS may be a constant voltage signal. However, the read bias control signal VBIAS may be a pulse signal that is only activated during the read operation.

The nonvolatile memory device according to the first embodiment of the present invention includes the decoupling unit 100a so as to remove the noise from the clamping control signal VCMP. Accordingly, the bit line BL can be clamped at a predetermined bias level, and thus the sensing margin can be increased. Since the operation error of the read operation can be reduced, reliability can be improved.

Figure 5:
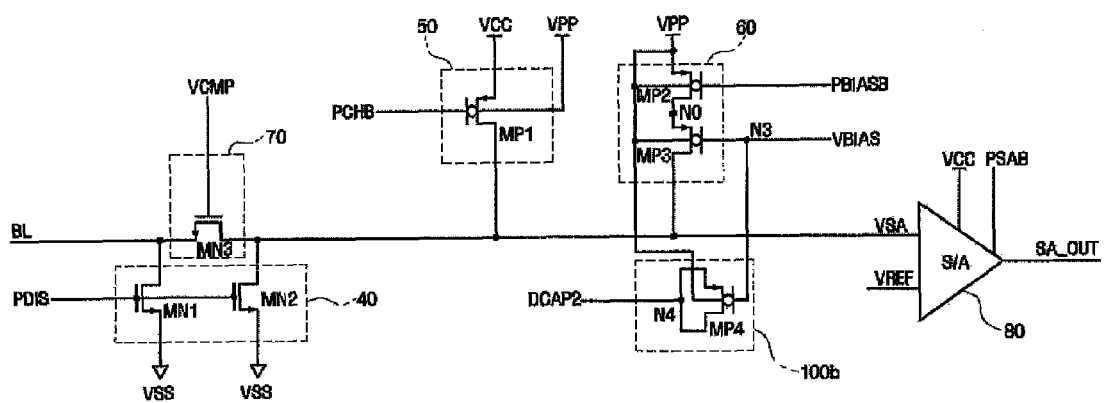
FIG. 5 is a circuit diagram illustrating a data read circuit that is used in a nonvolatile memory device according to a second embodiment of the present invention.
Figure 6:
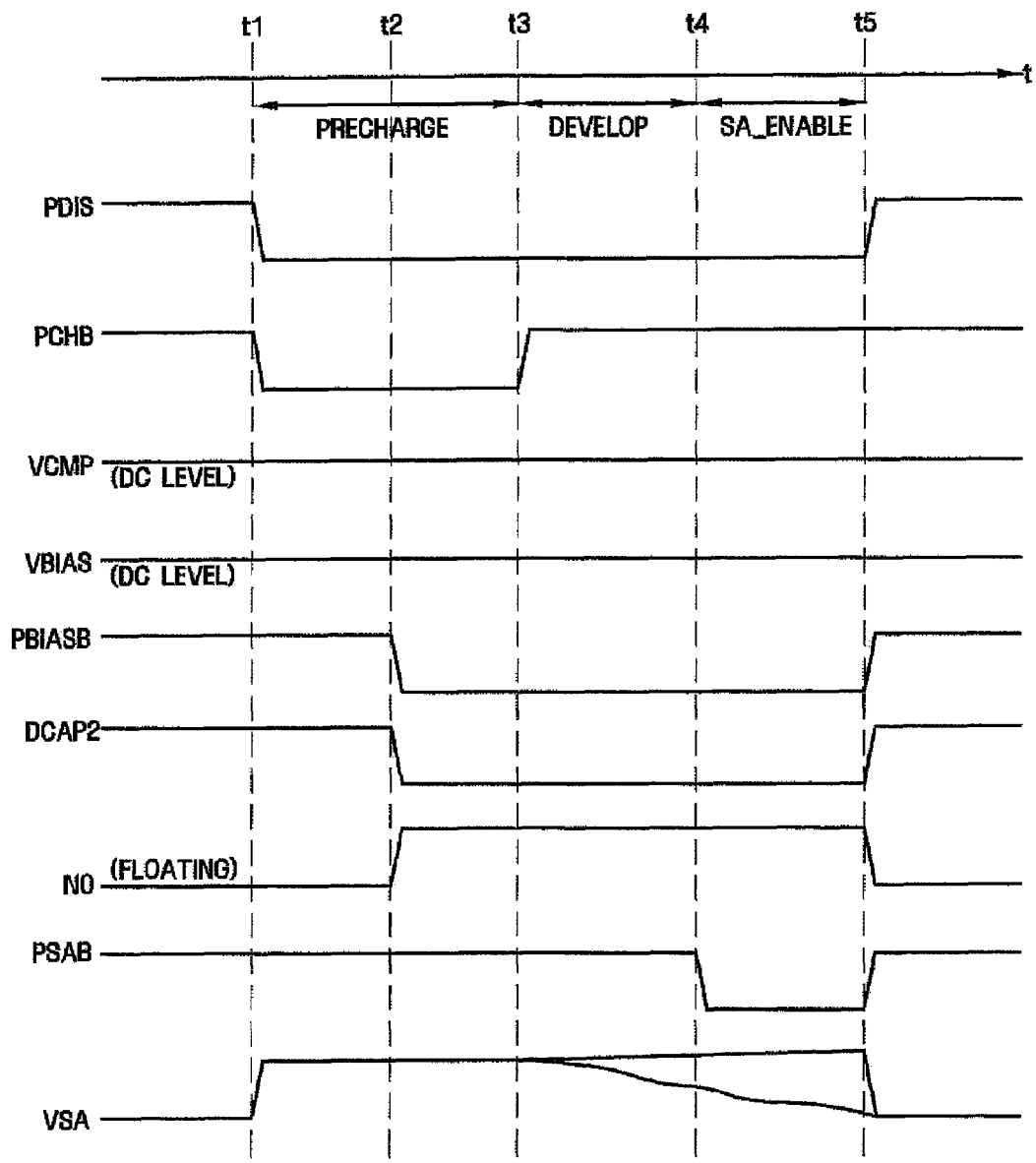
FIG. 6 is a timing diagram illustrating the operation of the data read circuit shown in FIG. 5.
Figure 7:
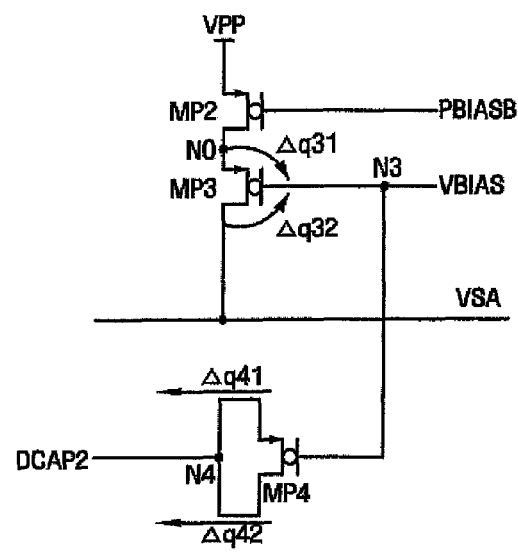
FIG. 7 is a circuit diagram of a portion of the data read circuit shown in FIG. 5.

FIG. 5 is a circuit diagram illustrating a data read circuit that is used in a nonvolatile memory device according to a second embodiment of the present invention. FIG. 6 is a timing diagram illustrating the operation of the data read circuit shown in FIG. 5. FIG. 7 is a circuit diagram of a portion of the data read circuit shown in FIG. 5. The same components as those in FIGS. 2 to 4 are denoted by the same reference numerals, and the detailed description thereof will be omitted. The embodiment of FIG. 5 does not include the decoupling unit 100a.

Referring to FIG. 5, a decoupling unit 100b that is used in the nonvolatile memory device according to a second embodiment of the present invention removes noise of a read bias control signal VBIAS. Specifically, when a read bias supply unit 60 starts to supply a read bias to a sensing node VSA, it is possible to remove the noise that affects the read bias control signal VBIAS. The decoupling unit 100b may include a second decoupling capacitor MP4 that is coupled between a third node N3 to which the read bias control signal VBIAS is applied and a fourth node N4 to which a second decoupling signal DCAP2 is applied. For example, as shown in FIG. 5, the second decoupling capacitor MP4 may be an MOS capacitor. The MOS capacitor MP4 includes a gate to which the read bias control signal VBIAS is applied and a source and a drain to which the second decoupling signal DCAP2 is applied.

The operation of the data read circuit shown in FIG. 5 will now be described with reference to FIGS. 5 to 7.

Since a discharge signal PDIS is activated at a high level before time t1, a sensing node VSA and a bit line BL coupled to a selected nonvolatile memory cell are discharged with a ground voltage VSS.

At time t1, the discharge signal PDIS is inactivated at a low level, and a precharge signal PCHB is activated at a low level, such that the sensing node VSA is precharged with a power supply voltage VCC.

At time t2, a selection signal PBIASB is activated at a low level, and the read bias supply unit 60 supplies a read bias to the sensing node VSA. Further, while the second decoupling signal DCAP2 is activated at a low level, noise that is generated in the read bias control signal VBIAS is removed. Here, the second decoupling signal DCAP2 may be a signal that transits when the read bias supply unit 60 starts to supply the read bias to the sensing node VSA and has a voltage difference from the read bias control signal VBIAS. For example, in FIG. 6, when the selection signal PBIASB is activated at a low level, the second decoupling signal DCAP2 transits from a high level to a low level. For example, the second decoupling signal DCAP2 may be the same signal as the selection signal PBIASB.

As a voltage of a node N0 and a voltage of the sensing node VSA increase, a voltage of the node N0 and a voltage of the sensing node VSA may affect the read bias control signal VBIAS. That is, noise may be generated in the read bias control signal VBIAS. As shown in FIG. 7, charges Δq31 and Δq32 may be transmitted from the node N0 and the sensing node VSA, respectively, to the third node N3 to which the read bias control signal VBIAS is applied, through a parasitic capacitor between a gate and a source of an NMOS transistor MP3 and a parasitic capacitor between the gate and a drain thereof. In this case, a voltage level of the read bias control signal VBIAS may not remain constant. In the second embodiment of the present invention, since the second decoupling signal DCAP2 is activated at the low level, the charges Δq31 and Δq32 transmitted to the third node N3, to which the read bias control signal VBIAS is applied, move to the fourth node N4, to which the second decoupling signal DCAP2 is applied, through the second decoupling capacitor MP4 (see Δq41 and Δq42).

To maintain the voltage level of the read bias control signal VBIAS, the charges Δq31 and Δq32 transmitted to the third node N3 and the charges Δq41 and Δq42 moving to the fourth node N4 may be equal. Therefore, the PMOS transistor MP3 of the read bias supply unit 60 and the MOS capacitor MP4 of the decoupling unit 100b may be adjusted to have the same size. For example, when the width and length of the PMOS transistor MP3 are W3 and L3, respectively, and the width and length of the MOS capacitor MP4 are W4 and L4, W3=W4 and L3=L4 may be specified.

Referring to FIG. 6 again, at time t3, the precharge signal PCHB is inactivated at a high level.

At time t4, a sense amplifier enable signal PSAB is enabled at a low level. Therefore, a level of the sensing node VSA is compared with a reference level VREF in the S/A 80, and the comparison result is output as SA_OUT.

At time t5, the discharge signal PDIS is activated again to a high level. The selection signal PBIASB, the second decoupling signal DCAP2, and the sense amplifier enable signal PSAB are inactivated at a high level. In this way, the read operation ends.

Figure 8:
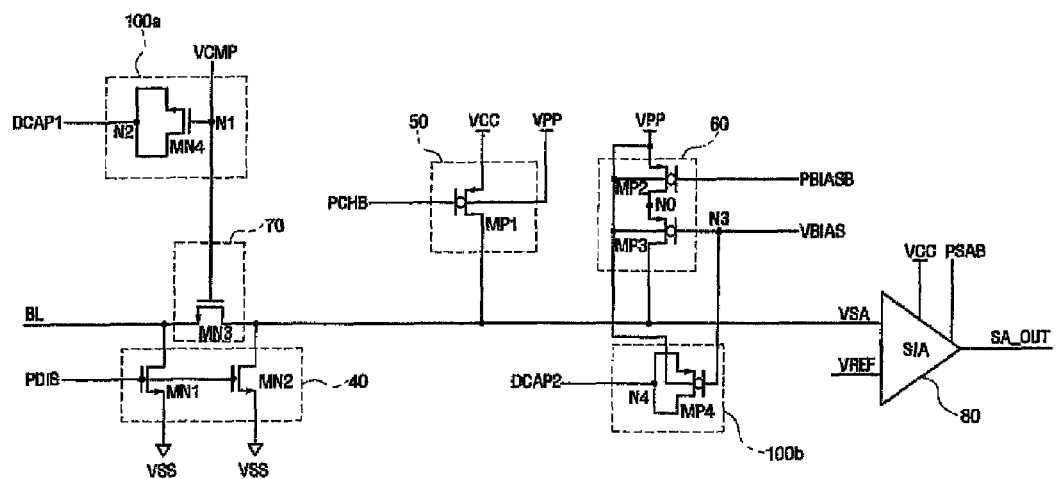
FIG. 8 is a circuit diagram illustrating a data read circuit that is used in a nonvolatile memory device according to a third embodiment of the present invention.

FIG. 8 is a circuit diagram illustrating a data read circuit that is used in a nonvolatile memory device according to a third embodiment of the present invention. The same components as those in FIGS. 2 to 7 are denoted by the same reference numerals, and the detailed description thereof will be omitted.

Referring to FIG. 8, the nonvolatile memory device according to the third embodiment of the present invention includes both the decoupling unit 100a described in FIG. 2 and the decoupling unit 100b described in FIG. 5. The nonvolatile memory device according to the third embodiment of the present invention removes noise of a clamping control signal VCMP and noise of a read bias control signal VBIAS. Therefore, it is possible to increase a sensing margin and improve reliability of a read operation.

Figure 9:
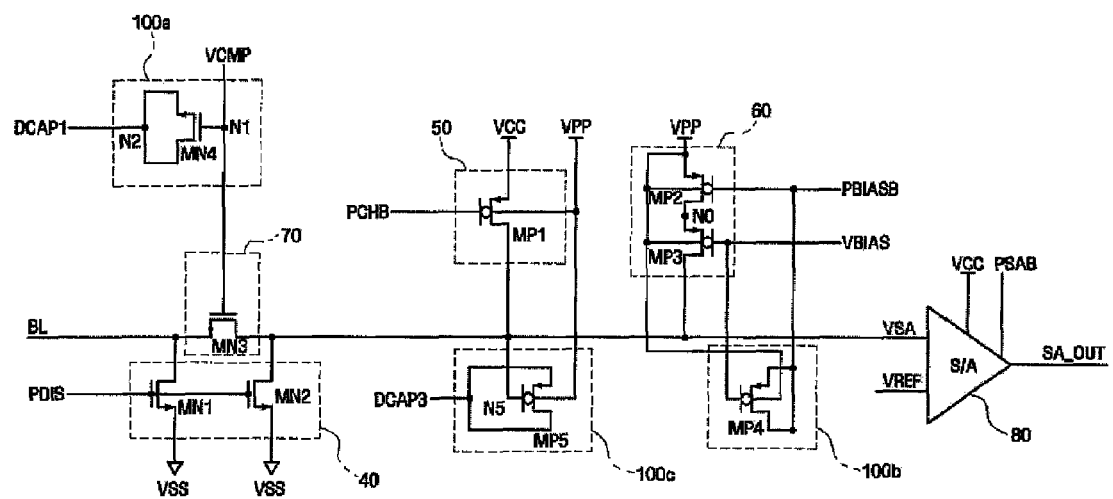
FIG. 9 is a circuit diagram illustrating a data read circuit that is used in a nonvolatile memory device according to a fourth embodiment of the present invention.
Figure 10:
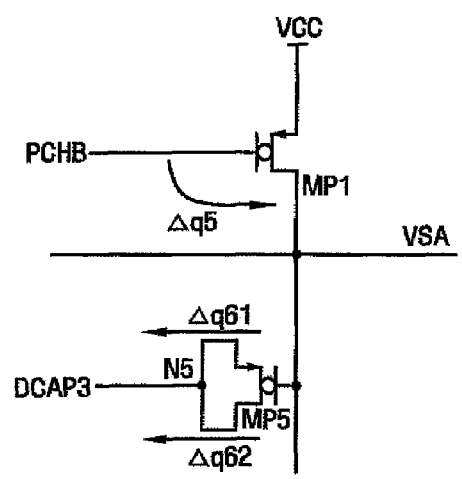
FIG. 10 is a circuit diagram of a portion of the data read circuit shown in FIG. 9.
Figure 11:
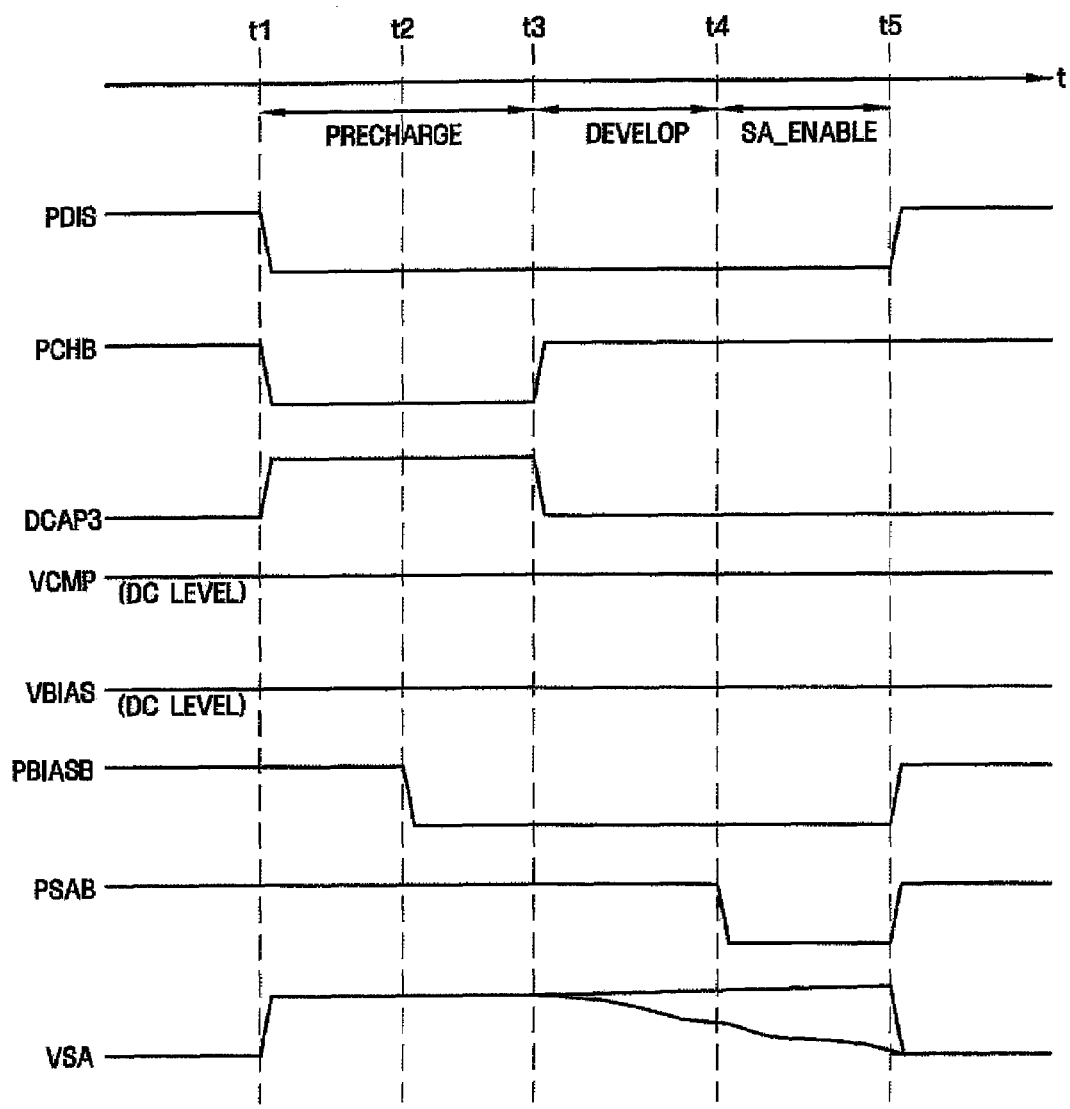
FIG. 11 is a timing diagram illustrating the operation of the data read circuit shown in FIG. 9.

FIG. 9 is a circuit diagram illustrating a data read circuit that is used in a nonvolatile memory device according to a fourth embodiment of the present invention. FIG. 10 is a circuit diagram of a portion of the data read circuit shown in FIG. 9. FIG. 11 is a timing diagram illustrating the operation of the data read circuit shown in FIG. 9. The same components as those in FIGS. 2 to 8 are denoted by the same reference numerals, and thus the detailed description thereof will be omitted.

Referring to FIG. 9, the nonvolatile memory device according to the fourth embodiment of the present invention includes a decoupling unit 100c that removes noise that affects a voltage of a sensing node VSA when the precharge unit 50 finishes precharging the sensing node VSA, in addition to the decoupling unit 100a described with reference to FIG. 2 and the decoupling unit 100b described with reference to FIG. 5. The decoupling unit 100c may include a third decoupling capacitor MP5 that is coupled between the sensing node VSA and a fifth node N5 to which a third decoupling signal DCAP3 is applied. For example, as shown in FIG. 9, the third coupling capacitor MP5 may be an MOS capacitor. Specifically, the MOS capacitor MP5 includes a gate that is coupled to the sensing node VSA and a source and a drain to which the third decoupling signal DCAP3 is applied.

Meanwhile, a second decoupling capacitor MP4 of the decoupling unit 100b includes a first electrode that is connected to the read bias control signal VBIAS and a second electrode that is connected to a selection signal PBIASB. Alternatively, the second electrode of the second decoupling capacitor MP4 may be coupled to the second decoupling signal DCAP2, as described above with reference to FIG. 5.

Referring to FIGS. 9 to 11, at time t3, a precharge signal PCHB is inactivated at a high level, such that the precharge operation of the precharge unit 50 is completed. At this time, the third decoupling signal DCAP3 is activated at a low level, such that noise that is generated in the sensing node VSA is removed. Here, the third decoupling signal DCAP3 may be a signal that transits when the precharge unit 50 finishes precharging the sensing node VSA. In FIG. 11, when the precharge signal PCHB is inactivated at a high level, the third decoupling signal DCAP3 transits from the high level to the low level. The third decoupling signal DCAP3 may be, for example, a complementary signal of the precharge signal PCHB.

When the precharge signal PCHB becomes a high level, the precharge signal PCHB may affect the voltage of the sensing node VSA. That is, noise may be generated in the sensing node VSA. As shown in FIG. 10, a charge $\Delta q5$ may be transmitted to the sensing node VSA through a parasitic capacitor between a gate and a source of a PMOS transistor MP1. In this case, a voltage level of the sensing node VSA may not remain constant. At this time, in the fourth embodiment of the present invention, since the third decoupling signal DCAP3 is activated at the low level, the charge $\Delta q5$ transmitted to the sensing node VSA moves to a fifth node N5, to which the third decoupling signal DCAP3 is applied, through the third decoupling capacitor MP5 (see $\Delta q61$ and $\Delta q62$).

Though not shown in the drawings, those skilled in the art can make various modifications by modifying the above-described embodiments. For example, those skilled in the art can devise an embodiment that includes the decoupling unit 100a described in FIG. 2 and the decoupling unit 100c described in FIG. 9, an embodiment that includes the decoupling unit 100b described in FIG. 5 and the decoupling unit 100c described in FIG. 9, and other data read circuits having one or more of the decoupling units disclosed herein.

Figure 12A:
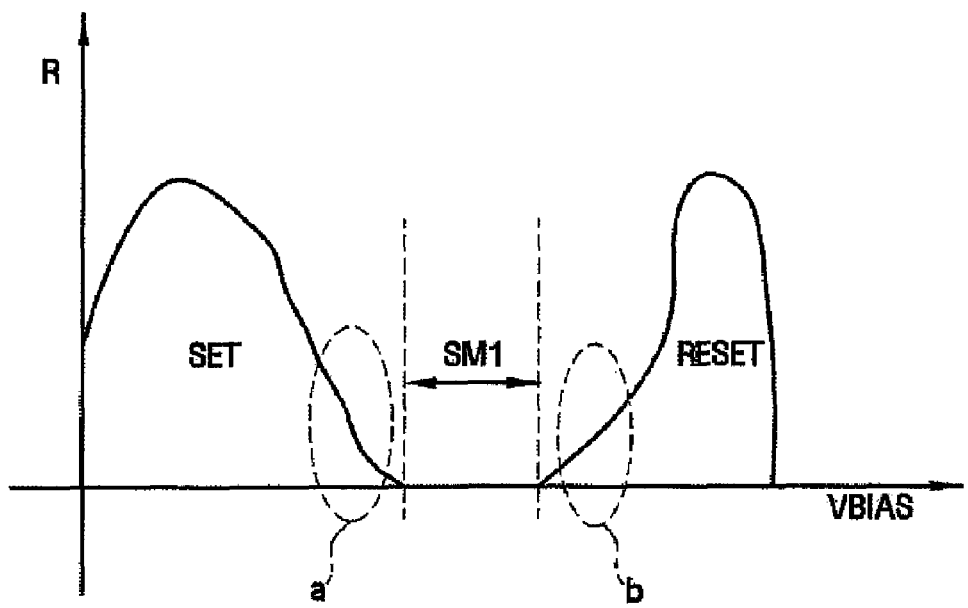
FIG. 12A is a voltage-resistance curve illustrating a sensing margin of a nonvolatile memory device according to the related art.
Figure 12B:
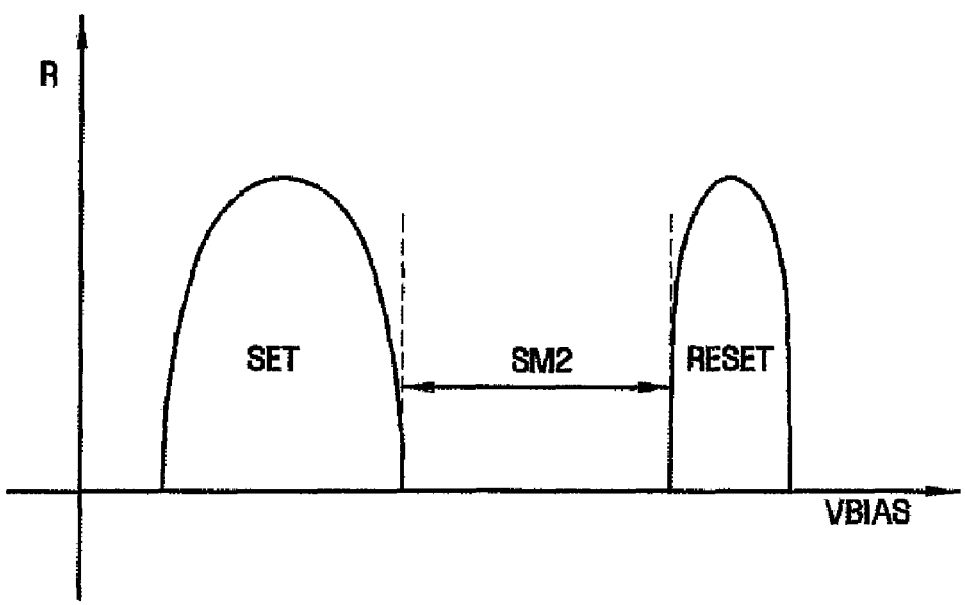
FIG. 12B is a voltage-resistance curve illustrating a sensing margin of the nonvolatile memory device according to the embodiments of the present invention.

FIG. 12A is a voltage-resistance curve illustrating a sensing margin of a nonvolatile memory device according to the related art. FIG. 12B is a voltage-resistance curve illustrating a sensing margin of the nonvolatile memory device according to the embodiments of the present invention.

Referring to FIGS. 12A and 12B, the nonvolatile memory device according to the related art includes a data read circuit that has a clamping unit, a precharge unit, a read bias supply unit, and a sense amplifier. As shown in FIG. 8, the nonvolatile memory device according to the embodiments of the present invention includes the decoupling unit that removes noise of the clamping control signal and the read bias control signal in addition to the clamping unit, the precharge unit, the read bias supply unit, and the sense amplifier.

An x axis indicates a read bias control signal VBIAS, and a y axis indicates resistance R.

In a case of the nonvolatile memory device according to the related art, since tails a and b are generated in the distribution of set data and the distribution of reset data, respectively, it can be seen that a sensing margin SM1 is small. Meanwhile, in a case of the nonvolatile memory device according to the embodiments of the present invention, since there are no tails of the distribution of the set data and the distribution of the reset data, it can be seen that a sensing margin SM2 is larger than the sensing margin SM1.

Although the present invention has been described in connection with the exemplary embodiments of the present invention, it will be apparent to those skilled in the art that various modifications and changes may be made thereto without departing from the scope and spirit of the present invention. Therefore, it should be understood that the above embodiments are not limitative, but illustrative in all aspects.

As described above, the nonvolatile memory device according to the embodiments of the present invention can increase a sensing margin by removing noise from one or more control signals (for example, a clamping control signal, a read bias control signal, and/or a precharge signal) that are used during the data read operation. Accordingly, the nonvolatile memory device according to the embodiments of the present invention can improve the reliability of a read operation.

What is claimed is:

1. A nonvolatile memory device comprising:
a memory cell array having a plurality of nonvolatile memory cells;
a selection circuit coupled to the memory cell array and configured to select at least one of the plurality of nonvolatile memory cells; and
a data read circuit coupled to the memory cell array, the data read circuit configured to read data from the selected nonvolatile memory cell, the data read circuit including:
a clamping unit coupled between a sensing node and a bit line associated with the selected nonvolatile memory cell, the clamping unit configured to clamp the bit line to a predetermined bias level in response to a clamping control signal;
a precharge unit coupled to the sensing node and configured to precharge the sensing node in response to a precharge signal;
a read bias supply unit coupled to the sensing node and configured to supply a read bias to the sensing node in response to a read bias control signal;
a sense amplifier coupled to the sensing node and a reference level, the sense amplifier configured to compare a level of the sensing node with a reference level and output a comparison result; and
a first decoupling unit coupled to the clamping control signal or the read bias control signal, and configured to reduce noise in the clamping control signal or the read bias control signal.

2. The nonvolatile memory device of claim 1, wherein the first decoupling unit is coupled to the clamping control signal, the decoupling unit being configured to reduce the noise that affects the clamping control signal when the precharge unit starts to precharge the sensing node.

3. The nonvolatile memory device of claim 1, wherein the first decoupling unit is coupled to the clamping control signal, the first decoupling unit including a first decoupling capacitor that is coupled between a first node and a second node, the clamping control signal being coupled to the first node, and a first decoupling signal being coupled to the second node.

4. The nonvolatile memory device of claim 3, wherein the clamping control signal is a constant voltage signal and the first decoupling signal is configured to change state when the precharge unit starts to precharge the sensing node.

5. The nonvolatile memory device of claim 3, wherein the clamping unit comprises a first MOS transistor, a gate of the first MOS transistor being coupled to the clamping control signal, the first decoupling capacitor being a first MOS capacitor, a gate of the first MOS capacitor being coupled to the clamping control signal, a source and a drain of the first MOS capacitor being coupled to the first decoupling signal.

6. The nonvolatile memory device of claim 5, wherein physical dimensions of a channel region of the first MOS transistor are substantially the same as physical dimensions of a channel region of the first MOS capacitor.

7. The nonvolatile memory device of claim 1, wherein the first decoupling unit is coupled to the read bias control signal, the first decoupling unit being configured to reduce the noise that affects the read bias control signal when the read bias supply unit supplies the read bias control signal to the sensing node.

8. The nonvolatile memory device of claim 1, wherein the first decoupling unit is coupled to the read bias control signal, the first decoupling unit including a decoupling capacitor coupled between a first node and a second node, the read bias control signal being coupled to the first node, a first decoupling signal being coupled to the second node.

9. The nonvolatile memory device of claim 8, wherein the read bias control signal is a constant voltage signal and the first decoupling signal is configured to change state when the read bias supply unit supplies the read bias control signal to the sensing node.

10. The nonvolatile memory device of claim 8, wherein the read bias supply unit includes a MOS transistor, a gate of the MOS transistor being coupled to the read bias control signal, and the decoupling capacitor is a MOS capacitor, a gate of the MOS capacitor being coupled to the read bias control signal, a source and a drain of the MOS capacitor being coupled to the first decoupling signal.

11. The nonvolatile memory device of claim 10, wherein physical dimensions of a channel region of the MOS transistor are substantially the same as physical dimensions of a channel region of the MOS capacitor.

12. The nonvolatile memory device of claim 10, wherein the first decoupling signal is a selection signal associated with the read bias supply unit.

13. The nonvolatile memory device of claim 1, wherein the first decoupling unit is coupled to the precharge unit, the first decoupling unit being configured to reduce the noise that affects a level of the sensing node when the precharge unit finishes precharging the sensing node.

14. The nonvolatile memory device of claim 1, wherein the first decoupling unit is coupled to the precharge unit, the first decoupling unit including a decoupling capacitor that is coupled between the sensing node and a node to which a first decoupling signal is applied.

15. The nonvolatile memory device of claim 14, wherein the first decoupling signal is a complementary signal of the precharge signal.

16. The nonvolatile memory device of claim 14, wherein the precharge unit includes a MOS transistor, a gate of the MOS transistor being coupled to the precharge signal, and the decoupling capacitor is a MOS capacitor, a gate of the MOS capacitor being coupled to the sensing node and a source and a drain of the MOS capacitor being coupled to the first decoupling signal.

17. The nonvolatile memory device of claim 1, wherein each of the plurality of nonvolatile memory cells includes a variable resistive element and an access element.

18. The nonvolatile memory device of claim 1, the first decoupling unit being coupled to the clamping control signal, the nonvolatile memory device further comprising a second decoupling unit coupled to the read bias supply unit, the first decoupling unit configured to reduce the noise in the clamping control signal, the second decoupling unit configured to reduce the noise in the read bias control signal.

19. The nonvolatile memory device of claim 18, further comprising a third decoupling unit coupled to the precharge unit, the third decoupling device configured to reduce the noise apparent at the sensing node.

20. The nonvolatile memory device of claim 19, wherein the first decoupling unit is coupled to a first decoupling signal, the second decoupling unit is coupled to a second decoupling signal, and the third decoupling unit is coupled to a third decoupling signal, the first decoupling unit including a first decoupling capacitor coupled between the clamping control signal and the first decoupling signal, the second decoupling unit including a second decoupling capacitor coupled between the read bias control signal and the second decoupling signal, the third decoupling unit including a third decoupling capacitor coupled between the sensing node and the third decoupling signal.

* * * * *